United States Patent [19]
Grant et al.

[11] Patent Number: 5,358,615
[45] Date of Patent: Oct. 25, 1994

[54] PROCESS FOR FORMING A SPUTTER DEPOSITED METAL FILM

[75] Inventors: Leroy Grant; Robert Fiordalice, both of Austin; Iraj E. Shahvandi, Round Rock, all of Tex.

[73] Assignee: Motorola, Inc., Schaumburg, Ill.

[21] Appl. No.: 140,341

[22] Filed: Oct. 4, 1993

[51] Int. Cl.[5] .............................................. C23C 14/34
[52] U.S. Cl. ......................... 204/192.15; 204/192.12; 204/298.12; 204/298.13; 204/298.11; 437/192; 437/196
[58] Field of Search ...................... 204/298.11, 298.12, 204/298.13, 192.12, 192.15, 192.17; 437/192, 196

[56]         References Cited
          U.S. PATENT DOCUMENTS

| | | | |
|---|---|---|---|
| 4,964,969 | 10/1990 | Kusakabe et al. | 204/298.12 |
| 5,118,661 | 6/1992 | Maeda | 505/1 |
| 5,155,063 | 10/1992 | Ito | 437/190 |
| 5,190,630 | 3/1993 | Kikuchi et al. | 204/192.12 |
| 5,282,943 | 2/1994 | Lannutti et al. | 204/192.12 |

Primary Examiner—Nam Nguyen
Attorney, Agent, or Firm—Jasper W. Dockrey

[57] ABSTRACT

A metal deposition process in which a high-purity metal film (46) is sputter deposited within a sputtering system (10) having insitu passivated metal components. A sputtering target (14) is provided having a thin aluminum coating (44) overlying a refractory metal layer (42). During operation, the aluminum coating (44) is sputtered away from the target (14) and onto exposed metal surfaces within the vacuum chamber (20) of the sputter deposition system (10). Subsequently, a semiconductor substrate (38) is placed in the sputter deposition system (10) and a high-purity metal film (46) is deposited onto the semiconductor substrate (38). Because the insitu passivation process avoid the oxidation of the passivating aluminum, refractory metal sputtered away from the target (14) adheres to the passivating aluminum layer, and does not re-deposit onto the surface of the semiconductor substrate (38) during the sputter deposition process.

10 Claims, 1 Drawing Sheet

PROCESS FOR FORMING A SPUTTER DEPOSITED METAL FILM

FIELD OF THE INVENTION

This invention relates in general to a method for fabricating a semiconductor devices, and more particularly to a method for the sputter deposition of metal films in a semiconductor fabrication process.

BACKGROUND OF THE INVENTION

The trend in semiconductor fabrication is toward faster and more complex devices. Increased operating speeds are typically attained through the fabrication of devices having small feature sizes, and through the use of a variety of electrically conductive metals. A multitude of different metals and metal alloys are now in use which increase device operating speeds, and in some cases, provide a diffusion barrier to protect the devices from contamination. Further, complex metallization structures are being used to form electrical interconnection to the various components found in an integrated circuit. The need for complex metallization systems has occurred, in part, as a result of the need to form many overlying layers of conductive interconnects to electrically couple the vast number of device components in an integrated circuit.

The process technology fused to form the metallization structures must have the capability to produce metal films of high purity. The deposited metal films must not only be highly electrically conductive, but also must possess the necessary optical reflectivity characteristics to enable high definition photolithographic processing. In order to meet the film quality requirements demanded in semiconductor fabrication, sputter deposition has become a widely used technique. A metal sputtering process is typically carried out in an ultra-high vacuum environment in which processing parameters, such as metal film deposition rates and morphological characteristics of the metal film, can be carefully controlled. Using a state of the art sputtering process, a metal film can be rapidly deposited onto the surface of a semiconductor substrate, while controlling the grain size and film thickness uniformity with a high degree of precision. Additionally, the sputter deposition process is adaptable to the formation of metal alloy films, either by using multi-component sputtering targets, or by introducing reactive gases into the sputter deposition system.

Although a sputtering system can be adapted to produce a variety of metals and metal alloys, the deposition of certain metals and their alloys can be accompanied by high levels of contamination during the sputter deposition process. For example, many refractory metals do not adhere well to metal surfaces commonly present in a sputter deposition chamber. During a sputter deposition process, in addition to depositing a metal layer on the semiconductor substrate, the metal being deposited from a sputtering target also coats the exposed metal surfaces within the sputter deposition chamber. If the sputtered metal does not adhere well to the metal surfaces within the deposition chamber, the sputtered metal can continuously peel away from the chamber surfaces and contaminate the film deposited on the semiconductor substrate.

One method of preventing film contamination from sputtering system components, is to disassemble the components of the chamber and individually coat the components with a metal having good adhesion properties. The individually coating of metal components requires that the vacuum chamber be open to ambient atmosphere, and each individual component removed and disassembled. In addition to requiring a large amount of time, and associated loss of production capacity, the individual component coating method exposes the coated components to oxygen in the ambient atmosphere. The coating metal can oxidize during periods prior to reinstallation into the sputtering apparatus. Aluminum is a commonly used adhesion metal, which readily oxidizes to form aluminum oxide. The formation of aluminum oxide is undesirable because aluminum oxide does not have the adhesion properties of elemental aluminum.

Another component passivation approach is to fabricate the internal components of the sputtering system from a metal which inherently has good adhesive properties. However, the fabrication of internal components from an adhesive metal is expensive and can compromise the structural integrity of the sputter deposition system. Additionally, whenever the sputtering system is open to atmosphere, the internal components can be subject to oxidation. Accordingly, further development of sputter deposition processes is necessary to provide high-purity sputter deposited metal films, while avoiding excessive expense and loss of production time.

SUMMARY OF THE INVENTION

In practicing the present invention there is provided a process for a sputter depositing a high-purity metal film in a semiconductor device. A high-purity metal film is deposited onto a semiconductor substrate within a sputtering apparatus having insitu-passivated internal surfaces. In one embodiment, a sputtering target is provided having a surface layer of aluminum overlying a refractory metal layer. The surface layer of aluminum is sputtered away to expose the underlying refractory metal layer. Thereafter, refractory metal layers are subsequently deposited onto semiconductor substrates by sputter deposition from the sputtering target. In the process of the invention exposure of the passivating aluminum to ambient atmospheric conditions is avoided. The internal elements of the sputter deposition chamber are passivated directly from aluminum which has been coated onto the surface of the sputtering target. The insitu-passivation process reduces the maintenance time necessary to prepare the sputter deposition system for production activity. The process of the present invention, in one aspect, provides both high-purity metal films, and a highly efficient metal deposition process.

Figure 1:
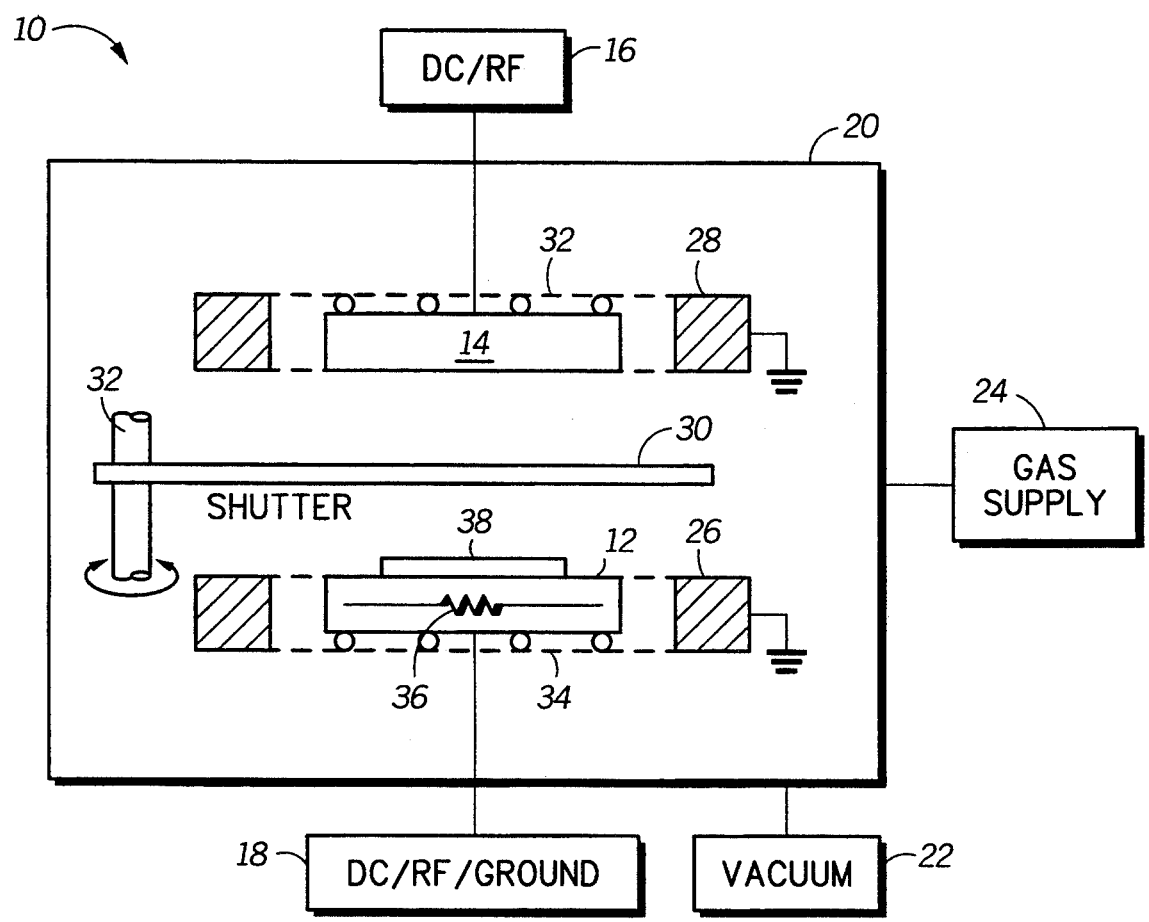
FIG. 1 is a schematic diagram of an exemplary sputter deposition system.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE PREFERRED EMBODIMENTS

In the reactive sputter deposition of metal films it often occurs that the particular metal being deposited does not adhere well onto internal metal surfaces of the deposition system. When poor adhesion occurs, metal particles can dislodge from internal metal surfaces and become trapped in the metal film, which is being sputter deposited onto a semiconductor substrate. The metal particulate contaminates can reduce the electrical conductivity of the deposited metal films, and in the case of sputter deposition of a multi-component film, can alter the stoichiometry of the sputtered film. The present invention provides both a sputtering system component and a process which reduces the contamination of deposited films caused by metal flaking during the sputter deposition process.

Shown in FIG. 1 is a schematic diagram of an exemplary sputter deposition system 10. Sputtering system 10 is equipped with a substrate stage 12 aligned parallel to and opposite from a sputtering target 14. Both substrate stage 12 and sputtering target 14 are electrically coupled to power supplies which can apply either direct current or radio frequency power to either electrode. As illustrated, target power supply 16 can be adjusted by the user to apply either DC voltage or RF frequency power to sputtering target 14. Similarly, stage power supply 18 can supply either DC or RF power to stage 12, or alternatively, can supply a ground signal to stage 12. Both stage 12 and target 14 are contained within a vacuum chamber 20, which can be evacuated to ultra high vacuum by vacuum system 22. Reactive and inert gases can be introduced to vacuum chamber 20 by gas supply system 24. By controlling both the evacuation rate and the gas introduction rate, the internal pressure of vacuum chamber 20 can be controlled at a desired level during the sputter deposition process.

Both substrate stage 12 and sputtering target 14 are surrounded by ground shields 26 and 28, respectively. Ground shields 26 and 28 function to confine the ion bombardment to sputtering target 14 during the sputter deposition process,. In the absence of a ground shield, internal target support structures, such as a backing plate, mounting clips, and mechanical supports, and the like, could also be subjected to ion bombardment. The ion bombardment of mechanical structures supporting sputtering target 14 can result in film contamination in the metal film being deposited on a semiconductor substrate. To function properly, the ground shields must be spaced at a carefully defined distance from the target and the substrate stage. Typically, the spacing distance is extremely small in order to prevent local discharges, known as voltage arcs, between the ground shield and the electrode. Ground shields are also supplied for the substrate stage to facilitate the operation of the sputtering system while applying a bias voltage to the substrate stage.

Sputtering system 10 is equipped with a shutter 30, which is positioned between substrate stage 12 and sputtering target 14. Shutter 30 is attached to a rotating arm 32 and can be rotated away from target 14 and expose underlying substrate stage 12. Shutter 30 is positioned between stage 12 and target 14 during the initial power-up period when the first few atomic layers are sputtered away from target 14. During the pre-sputtering period, any contaminants present on the surface of target 14 are sputter deposited onto shutter 30. Once the pre-sputtering period is complete, shutter 30 is rotated away from target 14 and the sputter deposition process continues onto stage 12.

Target 14 is equipped with cooling coils 32 which prevent the temperature of target 14 from temperature induced damage during the sputter deposition process. Excessive target temperatures can lead to damage of the bonding between the target and the backing electrode and fields associated with the target mounting mechanisms. Similarly, substrate stage 12 can be equipped with cooling coil 34 to prevent excessive temperatures of the semiconductor substrate during the sputter deposition process. Moreover, in certain sputter deposition processes, the formation of a desired alloy film can be influenced by the substrate temperature during sputter deposition. Further temperature control capability can be provided by heating elements 36 positioned internal to substrate stage 12.

Those skilled in the art will appreciate that the foregoing description of sputtering system 10 is a general description of common, commercially available sputter deposition systems. Accordingly, not all of the previously described features are necessarily present on any particular sputter deposition system. Furthermore, a conventional sputter deposition system also includes many systems not illustrated in FIG. 1. Additionally, the configuration of the various components of sputtering system 10 can vary substantially from that shown. For example, ground shields 26 and 28 can be configured to partially overlap the front surfaces of substrate stage 12 and sputtering target 14.

In operation, a semiconductor substrate 38 is placed on substrate stage 12, and vacuum chamber 20 is evacuated to ultra-high vacuum pressure. A reactive or inert gas is introduced to vacuum chamber 20 from gas supply system 24. Then, either DC or RF power is applied to target 14 and a plasma is created in the space between substrate stage 12 and target 14. The electric fields induced by the power to target 14 cause ions to bombard the surface of target 14, thereby dislodging metal atoms from the surface of target 14. After the sputtering process is initiated, shutter 30 rotates away from target 14 and metal atoms are sputtered from the surface of target 14 and deposit on the surface of semiconductor substrate 38. Successive layers of metal atoms are sequentially deposited onto the surface of substrate 38 forming a thin-film on the substrate surface. The sputter deposition process is continued for a predetermined period of time, pending upon the rate of sputter deposition and the desired thickness of the deposited metal film. Upon completion of the sputter deposition process, substrate 38 is removed from vacuum chamber 20 and continues on to subsequent processing steps, which transform the deposited metal film into a patterned layer of metal interconnects.

The sputter deposition process for a multi-component film, such as a refractory-metal alloy, is preferably carried out by introducing a reactive gas into vacuum chamber 20, and sputtering a metal component from sputtering target 14. During the reactive sputter deposition process, or reactive ion sputtering (RIS) process, a gas phase reaction takes place between the reactive gas and the metal atoms sputtered from the target. For example, a titanium nitride film can be deposited by sputtering titanium metal from target 14 in the presence of reactive nitrogen gas. Under proper processing conditions, a titanium nitride film is formed on the surface of substrate 38. During the sputter deposition process, titanium atoms can also deposit on the surfaces of ground shields 26 and 28. Typically, the internal metal elements and mechanisms of a sputter deposition system are constructed from stainless steel. Since titanium does not adhere well to stainless steel surfaces, the titanium metal eventually flakes off the surface of shields 26 and 28 and can become trapped in the growing titanium nitride film on the surface of substrate 38.

Figure 2:
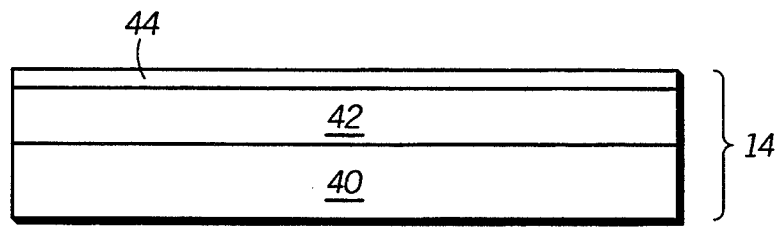
FIG. 2 illustrates, in cross-section, a sputtering target formed in accordance with the invention.

To prevent metal contamination during the active ion sputtering process, the refractory metal in target 14 is coated with a layer of aluminum, as illustrated in FIG. 2. Target 14 includes a backing plate 40, which supports a refractory metal layer 42. A thin aluminum layer 44 overlies the surfaces of refractory metal layer 42. Aluminum layer 44 can be incorporated into target 14 using a conventional metallization process. For example, aluminum layer 14 can be plated onto refractory metal layer 42 using a conventional plate bonding process. Additionally, aluminum layer 44 can be applied to refractory metal layer 42 by a plasma flame spraying process. Further, aluminum layer 44 can be evaporated onto refractory metal layer 42. Because aluminum layer 44 is removed from refractory metal layer 42 very early in the lifetime of sputtering target 44, aluminum layer 44 need only be secured to refractory layer 42 such that aluminum layer 44 will remain in place until early removal in the sputter deposition system.

The process of the present invention begins by placing target 14 in vacuum chamber 20. At the time of placing target 14 in vacuum chamber 20, shields 26 and 28 are also replaced. Next, a series of test substrates are sequentially processed in sputtering system 10. The test substrates are used for system burn-in and testing, and do not contain active semiconductor devices. As the test substrates are sequentially processed, aluminum layer 44 is sputtered from target 14. During the aluminum sputtering process, aluminum is deposited onto the test substrates, and onto exposed stainless steel surfaces of ground shields 26 and 28. The aluminum bonds to the stainless steel surfaces of ground shields 26 and 28, and completely coats the exposed surfaces of the ground shields with a thin layer of aluminum metal. Eventually, all of aluminum layer 44 is removed from the surface of refractory metal layer 42. At this point, the sputtering of refractory metal layer 42 is initiated.

Following the removal of aluminum layer 44 from target 14, the processing of active semiconductor devices begins. During a sputtering process to form, for example, a titanium nitride film on a semiconductor substrate, titanium nitride also forms on the aluminum metal surfaces of ground shields 26 and 28. Since titanium nitride adheres to aluminum, titanium nitride metal does not become dislodged from the surface of ground shields 26 and 28 during the sputter deposition process. Accordingly, highly pure titanium nitride films can be sputter deposited in sputtering system 10.

Figure 3:
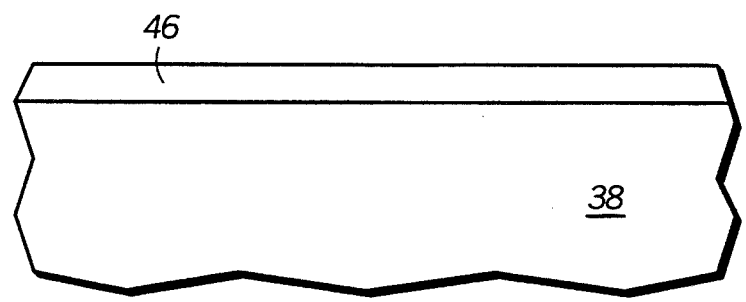
FIG. 3 illustrates, in cross-section, a portion of a semiconductor substrate having a high-purity metal film deposited in accordance with the invention.

Using the process of the present invention, a refractory metal alloy 46 is sputter deposited onto semiconductor substrate 38, as illustrated in FIG. 3. Refractory metal alloy film 46 is substantially free of metal contaminants introduced during the sputter deposition process. The highly pure condition of refractory metal alloy 46 enables the use of the alloy for formation of highly conductive metal leads. Additionally, the absence of film contamination enables the photolithographic patterning and etching of high definition interconnect features in a semiconductor device. The presence of metal contamination in a deposited film can cause inconsistencies in the etching process used to define metal interconnects. The absence of any such impurities enables refractory metal alloy 46 to be uniformly etched over the entire surface of a semiconductor device. Refractory metal alloy 46 can be one of a number of different alloys, such as titanium nitride, tungsten nitride, titanium tungsten, a copper alloy, and the like. Alternatively, the process of the present invention can be used to sputter deposit a pure metal layer, such as titanium, molybdenum, tungsten, gold, copper, and the like. In the case of sputter depositing a pure metal, an inert gas such as argon is introduced into vacuum chamber 20.

Those skilled in tile art will recognize that the foregoing process offers process efficiency advantages in addition to providing a high-purity thin-film. By passivating the internal metal surfaces of a sputter deposition system using an insitu aluminum deposition process, the need to continuously remove and clean shields within the sputter deposition chamber is reduced. Each time the system is opened and exposed to ambient atmospheric conditions, oxide layers form on the internal surfaces of the sputter deposition system. These oxide layers further reduce the adhesion of refractory metal films deposited during the sputter deposition process. By passivating internal surfaces using an insitu passivation process, the necessity of opening the system and exposing its atmospheric conditions is reduced.

Thus it is apparent that there has been provided, in accordance with the invention, a process for forming sputter deposited metal film which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, other reactive gases such as tungsten hexafluoride, and the like, can be used to form a RIS deposited titanium tungsten alloy film. It is therefore intended to include within the invention all such variations and modifications as fall within the scope of the appended claims and equivalents thereof.

We claim:

1. A process for fabricating a sputter deposited metal film in a semiconductor device comprising the steps of:
   providing a sputtering target having a surface layer of aluminum overlying a refractory metal layer;
   sputtering away the aluminum layer to expose the refractory metal layer; and
   forming a refractory metal layer on a semiconductor substrate by sputter deposition from the sputtering target.

2. The process of claim 1, wherein the sputtering process is carried out within a vacuum chamber having inner surfaces, and wherein the inner surfaces are coated with a layer of aluminum during the step of sputtering away the aluminum layer.

3. The process of claim 2, wherein the aluminum sputtering coats aluminum onto shielding elements surrounding the sputtering target.

4. A process for fabricating a sputter deposited metal film in a semiconductor device comprising the steps of:
   providing a sputter deposition system having a vacuum chamber, a substrate stage and a sputtering target within the vacuum chamber, and a shielding element surrounding the sputtering target, wherein the sputtering target comprises a metal coated with an aluminum layer;

insitu sputtering the aluminum layer onto the shielding element; and thereafter sequentially placing semiconductor substrates on the substrate stage and sputter depositing a metal film onto the substrates.

5. The process of claim 4, wherein the metal film is selected from the group consisting of titanium, titanium nitride, molybdenum, tungsten nitride, and tungsten.

6. The process of claim 4, wherein the step of sputter depositing a metal film is carried out without exposing the shielding elements to ambient atmosphere.

7. The process of claim 4, further comprising introducing a reactive gas into the vacuum chamber prior to depositing a metal film.

8. A process for fabricating a sputter deposited metal film in a semiconductor device comprising the steps of:

providing a vacuum chamber providing a sputtering target within the vacuum chamber, the sputtering target having a layer of aluminum overlying a refractory metal layer;

sputtering away the aluminum layer to expose the refractory metal layer;

introducing a reactive gas into the vacuum chamber; and forming a refractory metal alloy layer on a semiconductor substrate by sputter deposition from the sputtering target.

9. The process of claim 8, wherein the refractory metal layer is titanium, the reactive gas is nitrogen, and the refractory metal alloy layer is titanium nitride.

10. The process of claim 8, wherein the step of sputtering away the aluminum layer is carried Out without exposing the shielding elements to ambient atmosphere.

* * * * *